United States Patent
Gabriel

(10) Patent No.: US 6,313,727 B1
(45) Date of Patent: Nov. 6, 2001

(54) CURRENT TRANSFORMER FOR THREE-PHASE SYSTEMS

(75) Inventor: Rupprecht Gabriel, Oerlinghausen (DE)

(73) Assignee: Moeller GmbH, Bonn (DE)

( * ) Notice: Subject to any disclaimer, the term of this patent is extended or adjusted under 35 U.S.C. 154(b) by 0 days.

(21) Appl. No.: 09/486,272

(22) PCT Filed: Jul. 14, 1998

(86) PCT No.: PCT/EP98/04375

§ 371 Date: Feb. 23, 2000

§ 102(e) Date: Feb. 23, 2000

(87) PCT Pub. No.: WO99/05690

PCT Pub. Date: Feb. 4, 1999

(30) Foreign Application Priority Data

Jul. 21, 1997 (DE) .............................. 197 31 170

(51) Int. Cl.[7] .............................. H01F 38/20; H01F 17/06
(52) U.S. Cl. .......................... 336/174; 336/175; 336/178; 336/212; 336/234
(58) Field of Search .................... 336/174, 175, 336/178, 184, 212, 176, 234, 217, 73, 105

(56) References Cited

U.S. PATENT DOCUMENTS

| | | | | |
|---|---|---|---|---|
| 3,575,677 | * | 4/1971 | Fink | 336/175 |
| 4,258,348 | * | 3/1981 | Belfer et al. | 336/73 |
| 5,424,899 | * | 6/1995 | Scott et al. | 361/115 |
| 5,521,572 | * | 5/1996 | Goodwin et al. | 336/178 |

FOREIGN PATENT DOCUMENTS

| | | |
|---|---|---|
| 1079192 | 4/1960 | (DE) . |
| 3707707 | 9/1988 | (DE) . |
| 4229678 | 3/1994 | (DE) . |
| 195 05 812 C2 | 2/1995 | (DE) . |
| 0 758 749 A1 | 8/1996 | (EP) . |
| 2027669 | 10/1970 | (FR) . |

* cited by examiner

*Primary Examiner*—Lincoln Donovan
*Assistant Examiner*—Tuyen Nguyen
(74) *Attorney, Agent, or Firm*—Horst M. Kasper

(57) ABSTRACT

The invention relates to a current transformer for three-phase systems and it used to detect currents, for example with three-phase current meters or electronic devices which trigger low voltage protection breakers. The invention aims at developing a current transformer that can be produced and fixed in a simple and low cost fashion and permitting to measure total current. Therefore, four mutually spaced apart, parallel, identical cylindrical conversion coils (4–7) are provided. In each case, a three-phase current lead (1, 2, 3) runs between two conversion coils (4–5, 5–6, 6–7) arranged adjacent and substantially normal to their longitudinal axes (10). Conversion coils (4–7) are held headwise through two low coercivity yokes (8, 9) extending in their longitudinal axes plane.

21 Claims, 3 Drawing Sheets

Figure 1:
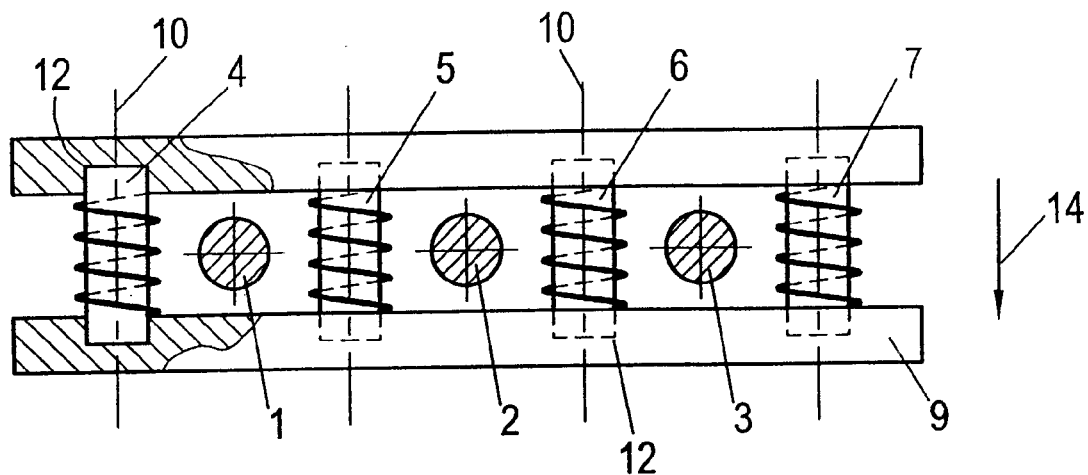
Figure 1A:
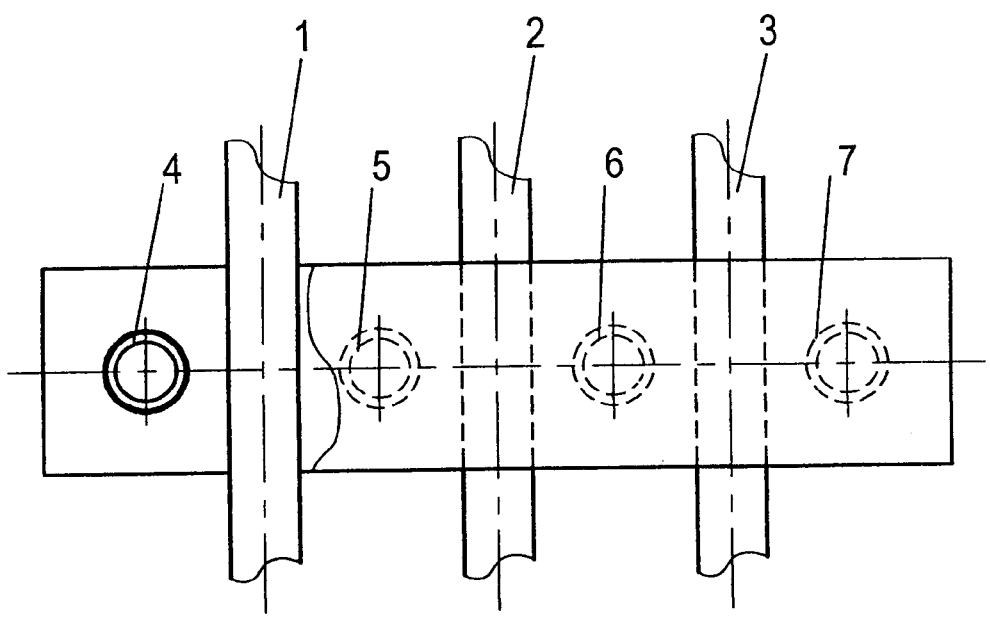

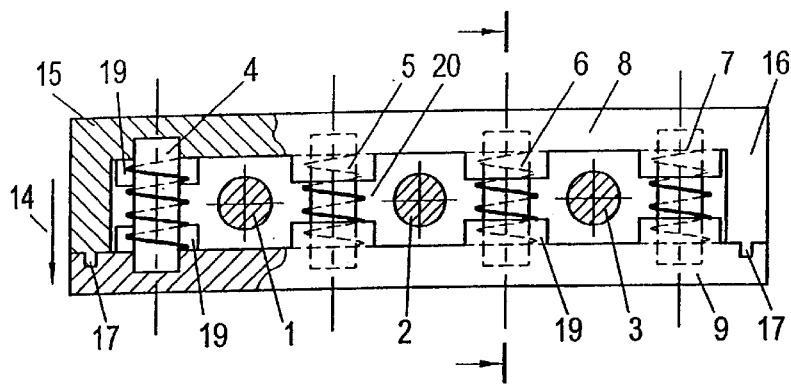
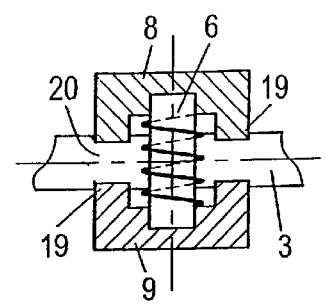
Fig. 3  Fig. 4
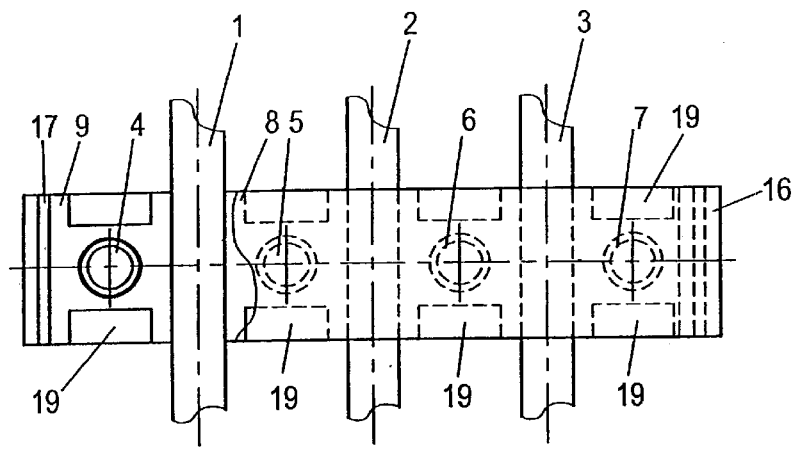
Fig. 3a

CURRENT TRANSFORMER FOR THREE-PHASE SYSTEMS

DESCRIPTION

The invention relates to a current transformer for three phase current systems and serves for the capturing of currents, for example, for three phase current meters or electronic trigger devices of low voltage circuit breakers.

PRIOR ART

On the one hand current converters are known as current transformers, wherein the main disadvantage of the current transformer comprises the saturation properties of the core material limiting precision and current ranges. On the other hand, ironless transformers (Rogowski-converters) are known, wherein the ironless transformers are suitable for a wide current region and require an integrating further processing of the current transformer signals. The use of toroid coils is a disadvantage in connection with ironless transformers, wherein the production and mounting of the torpid coils around the three phase conductors generally is associated with a high expenditure. For avoiding expensive round winding machines, a method for production of a current transformer formed of a Rogowski-coil and having a bendable non-magnetic winding support is proposed in the German printed patent document DE 42 29 678 A1. Accordingly a thermally deformable winding support is predeformed and is shifted onto a winding spindle formed as a straight line and is wound with the transformer coil. The hollow body returns into its anullar shape after pulling from the winding spindle. When using such coil in a three phase current system, the high technological care required for producing the current transformer and for mounting the current transformer is a disadvantage.

PRESENTATION OF THE INVENTION

Therefore, is an object of the invention to furnish a current transformer for three phase systems according to the Rogowski principle, where the current transformer can be produced and mounted easily and economically and which current transformer at the same time allows metering the sum current.

The object is accomplished according to the invention by the complete set of features of the independent claim, while advantageous embodiments of the invention can be gathered from the subclaims.

The support of the converter coils by soft magnetic yokes allow a simple and an uncomplicated production of the current transformer relative to the symmetry of the converter coils. On the one hand the measurement sensitivity of the current transformer is increased based on a bundling of the magnetic fields derived from the three phase current conductors and on the other hand the sensitivity to interference is decreased based on the shielding effect by the soft magnetic yokes. The magnetic effect of the yokes also balances dissymmetries between the transformer coils to a substantial degree. Since the sum current in a symmetric three phase systems is zero outside of a case of interference, the yokes to not reach even approximately the region of their magnetic saturation, wherefore the current transformer according to the present invention has to be considered operating according to the Rogowski principle. The conductor currents to be captured result in a conventional way from the difference or, respectively, the sum of the measurement voltages in each case of two transformer coils surrounding the corresponding three phase current conductor, depending on whether these converter coils are disposed relative to each other in the same or in an opposite winding sense. The current transformer is suitable for the capturing of the sum current of the three phase systems from the difference of the measurement voltages of the two outer converter coils to be integrated.

The yokes comprise ferrites or other suitable soft magnetic neck materials. Advantageously recesses are furnished in the yokes for supporting the converter coils.

Since the sum current normally is zero in a symmetrical three phase current system, according to an advantageous embodiment of the invention the magnetic circuit can be closed on two sides by cross yokes, which leads to a further increase of the shielding against magnetic interfering fields and to an improvement of the symmetry of the current converter. The yokes and cross yokes advantageously can be performed in two L-shaped or I-shaped, or, respectively, U-shaped parts but also as a complete unit.

According to an advantageous embodiment of the invention it is disclosed for a simplified mounting relative to so-called bushing transformers that one of the yokes is afterwards connectable to the remaining components of the current converter. The converter coils can be slipped without problem between the three phase current conductors thereby in order to complete thereafter the current transformer by connection with still missing soft magnetic parts.

A very stable further embodiment of the invention results by sideways disposed soft magnetic structures of the yokes in part covering the converter coils, wherein the embodiment is protected substantially against external mechanical as well as magnetic influences. The structures can start oppositely disposed or alternatingly disposed from the two yokes or only from one of the yokes while maintaining sufficient air gaps. An alternative further embodiment comprises the arrangement of soft magnetic webs framing the converter coils on the sides, where the soft magnetic webs are connected to the two yokes.

The invention is by no means limited to the described further embodiments and such embodiments, in particular combinations to be formed reasonably therefrom, shall be clearly included.

SHORT DESCRIPTION OF THE DRAWINGS

Figure 2:
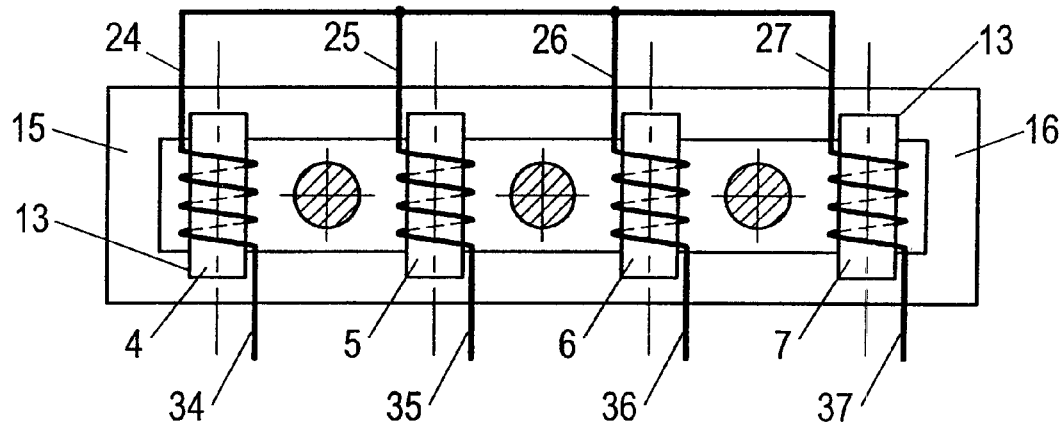
Figure 2A:
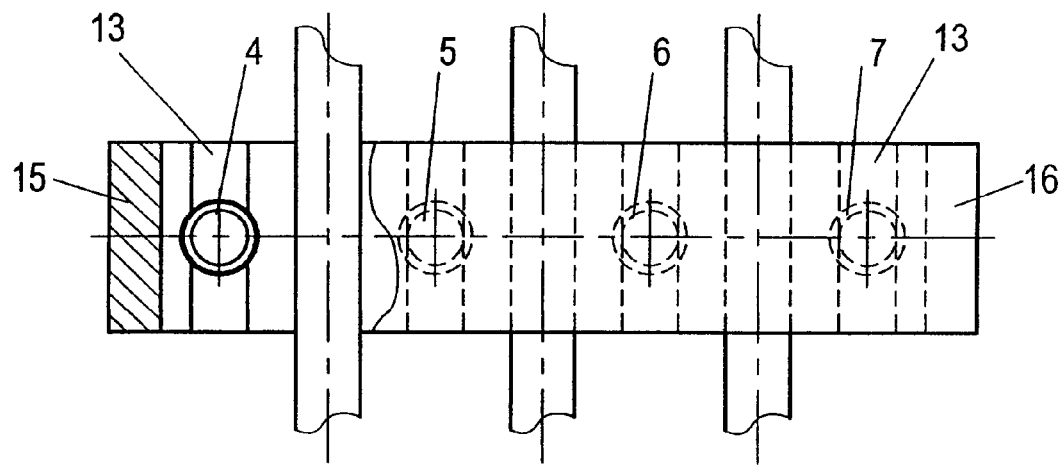

The invention is to be illustrated in more detail in the following by an embodiment, from which further features and advantages can be recognized. There is shown in the associated drawings in each case in a simplified presentation:

FIG. 1: a first embodiment of the current transformer according to the present invention in a longitudinal section;

FIG. 2: a second embodiment of the current transformer according to the present invention in a longitudinal section;

FIG. 3: a third embodiment of the current transformer according to the present invention;

FIG. 4: the sectional view IV—IV from FIG. 3.

BEST PATH FOR PERFORMING THE INVENTION

The current transformer according to FIG. 1 for capturing the currents of the three phase current conductors 1, 2 and 3 of a symmetrical three phase current system comprises four like converter coils 4, 5, 6 and 7 as well as 2 soft magnetic yokes 8 and 9. The winding of the converter coils 4 through 7 are fixed on cylindrical winding supports and are disposed parallel to each other in the same winding sense, such that they stand with their longitudinal axes 10 in a plane, wherein the plane is vertically penetrated by the three phase current conductors 1 through 3. In each case two converter coils 4, 5 or, respectively, 5, 6 or, respectively, 6, 7 form in each case a three phase current conductor 1 or, respectively, 2 or, respectively, 3 from the side. The transformer coils 4 through 7 are fixed on their head side in each case by cylindrical recesses 12 in the yokes 8, 9, wherein the cylindrical recesses 12 are essentially formed elongated and parallelepipedal and extend in their length also in the plane of the longitudinal axes 10 of the converter coils 4 through 7. The yokes 8, 9 are impacted only by a total magnetic flux of an unimportant amount based on the symmetry of the three phase current system. The current transformer can be slid as a total perpendicular to the drawing plane of FIG. 1 over the three phase current conductors 1 through 3 for mounting. Additionally, the converter coils 4 through 7 attached at the upper yoke 8 can be slid in a simple way in the direction of the arrow 14 between the three phase current conductors 1 through 3 in order to complete the current transformer in the following by attachment of the lower yoke 9 to the transformer coils 4 through 7.

The current converter according to FIG. 2 distinguishes itself from the preceding current converter by additionally furnished soft magnetic cross yokes 15 and 16. The cross yokes 15, 16 are also framed elongated and of parallelepipedal shape and connect the oppositely disposed ends of the yokes 8 and 9, such that all transformer coils 4 through 7 are surrounded by soft magnetic parts. The yokes 8, 9 and the cross yokes 15, 16 therefore form a closed magnetic circle, wherein the closed magnetic circle is impacted only by a negligible magnetic flux based on the symmetry of the three phase current system. This magnetic circuit shields the converter coils 4 through 7 to a high degree against magnetic interfering fields, improves the symmetry of the current transformer and the mechanical stability of the current transformer. The magnetic circuit of the yokes 8, 9 and of the cross yokes 15, 16 forms in this example a part which is throughout soft magnetic, where the transformer coils 4 through 7 are to be slid and to be fixed into the groove shaped recesses 13 of the soft magnetic part. The one set of coil connectors 24 through 27 of the transformer coils 4 through 7 disposed in the same winding sense are connected to each other, while the second set of coil connectors 34 through 37 are to be led to an evaluation circuit not to be described in detail.

The current transformer according to FIG. 3 and FIG. 4 exhibits two yokes 8, 9 and cross yokes 15, 16 connecting the two yokes 8, 9 at the end sides. The magnetic circuit formed in this example is composed however of two soft magnetic parts. The first part is of U-shape and comprises the upper yoke 8 as well as the two cross yokes 15, 17. This part with the converter coils 4 through 7 attached to it can be brought in turn between the three phase current conductors 1 through 3 from the side in the motion direction of the arrow 14. The second I-shaped part comprises the lower yoke 9 and can be connected in the following to the first part through groove and the spring like connection means 17 as well as to the remaining head ends of the converter coils 4 through 7. The yokes 8, 9 in addition exhibit strip like and oppositely disposed formations 19 at the two longitudinal sides, wherein the formations 19 overhang the converter coils 4 through 7 sideways. An additional protection against mechanical loads and magnetic interfering influences is thereby created. It is prevented that parts of the soft magnetic materials pass into the saturation region by providing a sufficiently large air gap 20 between in each case oppositely disposed formations.

What is claimed is:

1. A current transformer for three phase current systems consisting of:

four like cylinder-shaped transformer coils (4 through 7) are disposed parallel relative to each other;

and further comprising:

three current conductors forming a three phase current conductor unit, wherein in each case one of the three phase current conductors (1; 2; 3) runs between in each case two neighboring transformer coils (4,5; 5,6; 6,7) and substantially perpendicular to longitudinal axes (10) of the transformer coils (4, 5; 5, 6; 6, 7);

wherein the transformer coils (4 through 7) are supported between two soft magnetic yokes (8,9) extending in a common plane of the longitudinal axes (10) of the transformer coils (4 through 7) in a direction disposed perpendicular to a direction of the longitudinal axes.

2. The current transformer according to claim 1 wherein the two soft magnetic yokes (8, 9) exhibit recesses (12; 13) for receiving the transformer coils (4 through 7) on the head end side.

3. The current transformer according to claim 1 or 2, wherein the two soft magnetic yokes (8, 9) are magnetically connected outside of outer transformer coils (4, 7) surrounding the over two soft magnetic cross yokes (15,16) and wherein the outer transformer coils and the two soft magnetic cross yokes are disposed in a plane.

4. The current transformer according to claim 3 wherein each one of the two soft magnetic yokes (8; 9) is formed I-shaped with in each case the connecting cross yoke (15; 16).

5. The current transformer according to claim 3 wherein one of the two soft magnetic yokes (9) is I-shaped and wherein a second one of the two soft magnetic yokes (8) with two connected cross yokes (15, 16) is formed U-shaped.

6. The current transformer according to claim 3 wherein the two soft magnetic yokes (8, 9) and the two soft magnetic cross yokes (15,16) are formed to a single soft magnetic part.

7. The current transformer according to claim 1 or 2, wherein one of the two soft magnetic yokes (8, 9) is to be connected to the transformer coils (4 through 7) through recesses provided in the one of the two soft magnetic yokes (8,9).

8. The current transformer according to claim 3 wherein one of the two soft magnetic yokes (8, 9) is to be connected to the soft magnetic cross yokes (15, 16) and to the transformer coils (4 through 7)— through recesses provided in the one of the two soft magnetic yokes (8,9).

9. The current transformer according to claim 1, wherein at least one of the two soft magnetic yokes (8, 9) with side formations (19) extending toward an opposing yoke relative to the one of the two soft magnetic yokes and overhanging the transformer coils (4 through 7) on the side in such a way that magnetic saturation features are excluded under leaving of sufficient air gaps (20).

10. The current transformer according to claim 1 wherein the transformer coils (4 through 7) are framed like a cage by surrounding soft magnetic webs extending from the two soft magnetic yokes (8, 9), wherein extension planes of the webs extend parallel to the longitudinal axes (10) of the transformer coils (4 through 7) as well as perpendicular to the extension plane of the two soft magnetic yokes (8, 9), whereby magnetic saturation features of the two soft magnetic yokes are excluded by leaving a distance of the yokes (8, 9).

11. A current transformer for three phase current systems consisting of:
- four like cylinder-shaped transformer coils disposed parallel relative to each other and at a distance from each other and each having a longitudinal axis;

and comprising:
- three current conductors forming a three phase current conductor, wherein each one of the three phase current conductors runs between two respective neighboring cylinder-shaped transformer coils and wherein each one of the three phase current conductors runs essentially perpendicular to a plane spanned by the longitudinal axes of the transformer coils;
- two soft magnetic yokes supporting the transformer coils, wherein the two soft magnetic yokes extend in a plane of the longitudinal axes of the transformer coils and in a direction perpendicular to a direction of the longitudinal axes of the transformer coils.

12. The current transformer according to claim 11 wherein the two soft magnetic yokes exhibit recesses for receiving the transformer coils on the head end side of the yokes.

13. The current transformer according to claim 11, wherein the two soft magnetic yokes are magnetically connected outside of outer ones of the transformer coils in a same extension plane through two soft magnetic cross yokes.

14. The current transformer according to claim 13, wherein each one of the two soft magnetic yokes is formed I-shaped and wherein the two soft magnetic yokes are connected together with the two soft magnetic cross yokes.

15. The current transformer according to claim 13, wherein one of the two soft magnetic yokes is I-shaped and wherein a second one of the two soft magnetic yokes having attached the two soft magnetic cross yokes is formed U-shaped.

16. The current transformer according to claim 13, wherein the two soft magnetic yokes and the two soft magnetic cross yokes are formed to a single soft magnetic part.

17. The current transformer according to claim 11, wherein one of the two soft magnetic yokes is connected to the transformer coils.

18. The current transformer according to claim 13, wherein one of the two soft magnetic yokes is connected to the soft magnetic cross yokes and to the transformer coils.

19. The current transformer according to claim 11, wherein at least one of the two soft magnetic yokes is furnished with side formations extending toward an opposing one of the two soft magnetic yokes and overhanging the transformer coils on the side in such a way that sufficient air gaps are left for excluding magnetic saturation features.

20. The current transformer according to claim 11, wherein the transformer coils are formed like a cage by surrounding soft magnetic webs extending from the two soft magnetic yokes, wherein extension planes of the webs extend parallel to the longitudinal axes of the transformer coils as well as perpendicular to an extension plane of the two soft magnetic yokes, whereby magnetic saturation features of the two soft magnetic yokes are excluded by leaving a sufficient distance between the two soft magnetic yokes.

21. A current transformer for three phase current systems consisting of
- exactly four like cylinder-shaped transformer coils disposed parallel relative to each other and at a distance from each other and each having a longitudinal axis;

and comprising
- three current conductors forming a three phase current conductor, wherein each one of the three phase current conductors runs between two respective neighboring cylinder-shaped transformer coils and wherein each one of the three phase current conductors runs essentially perpendicular to a plane spanned by the longitudinal axes of the transformer coils;
- two soft magnetic yokes supporting the transformer coils on an end side, wherein the two soft magnetic yokes extend in a plane of the longitudinal axes of the transformer coils and in a direction perpendicular to a direction of the longitudinal axes of the transformer coils.

* * * * *